(12) United States Patent
Chen et al.

(10) Patent No.: US 8,916,969 B2
(45) Date of Patent: Dec. 23, 2014

(54) SEMICONDUCTOR DEVICES, PACKAGING METHODS AND STRUCTURES

(75) Inventors: Yu-Ren Chen, Taichung (TW); Ming Hung Tseng, Toufen Township (TW); Yi-Jen Lai, Chang Hua (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 424 days.

(21) Appl. No.: 13/194,606

(22) Filed: Jul. 29, 2011

(65) Prior Publication Data

US 2013/0026623 A1 Jan. 31, 2013

(51) Int. Cl.
*H01L 23/48* (2006.01)
*H01L 23/52* (2006.01)
*H01L 23/16* (2006.01)
*H01L 23/00* (2006.01)
*H01L 23/31* (2006.01)
*H01L 21/56* (2006.01)

(52) U.S. Cl.
CPC ..... *H01L 23/562* (2013.01); *H01L 2224/06155* (2013.01); *H01L 24/16* (2013.01); *H01L 2224/13647* (2013.01); *H01L 2224/73204* (2013.01); *H01L 2224/13082* (2013.01); *H01L 24/81* (2013.01); *H01L 24/13* (2013.01); *H01L 2224/13083* (2013.01); *H01L 2224/81191* (2013.01); *H01L 23/3128* (2013.01); *H01L 24/06* (2013.01); *H01L 2224/16225* (2013.01); *H01L 2224/81203* (2013.01); *H01L 21/563* (2013.01); *H01L 24/32* (2013.01); *H01L 24/92* (2013.01); *H01L 2224/0401* (2013.01); *H01L 2224/92125* (2013.01); *H01L 2224/81815* (2013.01); *H01L 2924/15311* (2013.01); *H01L 2224/131* (2013.01); *H01L 2224/05569* (2013.01); *H01L 23/16* (2013.01); *H01L 2224/05572* (2013.01); *H01L 24/73* (2013.01); *H01L 2224/73103* (2013.01); *H01L 2224/13655* (2013.01)
USPC ............ 257/737; 257/778; 257/E23.021

(58) Field of Classification Search
CPC ............ H01L 23/16; H01L 23/4331; H01L 2224/83192; H01L 24/29; H01L 24/81
USPC ................. 257/737, 778, E23.021
See application file for complete search history.

(56) References Cited

U.S. PATENT DOCUMENTS 5,186,383 A * 2/1993 Melton et al. ............ 228/180.22
5,448,114 A * 9/1995 Kondoh et al. ................ 257/778
5,700,715 A * 12/1997 Pasch ........................... 438/613

(Continued)

FOREIGN PATENT DOCUMENTS

JP  11-243116    9/1999
JP  2004 327611 A  11/2004

(Continued)

OTHER PUBLICATIONS

Korean Office Action, date mailed Apr. 19, 2013, 13 pages.

(Continued)

*Primary Examiner* — Nitin Parekh
(74) *Attorney, Agent, or Firm* — Slater & Matsil, L.L.P.

(57) ABSTRACT

Semiconductor devices, packaging methods and structures are disclosed. In one embodiment, a semiconductor device includes an integrated circuit die with a surface having a peripheral region and a central region. A plurality of bumps is disposed on the surface of the integrated circuit die in the peripheral region. A spacer is disposed on the surface of the integrated circuit die in the central region.

15 Claims, 5 Drawing Sheets

(56) References Cited

U.S. PATENT DOCUMENTS

| | | | | |
|---|---|---|---|---|
| 5,929,566 A | * | 7/1999 | Azami | 315/5.38 |
| 5,959,362 A | * | 9/1999 | Yoshino | 257/778 |
| 5,959,363 A | * | 9/1999 | Yamada et al. | 257/787 |
| 6,097,097 A | * | 8/2000 | Hirose | 257/778 |
| 6,175,157 B1 | * | 1/2001 | Morifuji | 257/777 |
| 6,239,488 B1 | * | 5/2001 | Chen | 257/737 |
| 6,733,880 B2 | | 5/2004 | Tanabe et al. | |
| 7,893,527 B2 | * | 2/2011 | Shin et al. | 257/698 |
| 7,939,934 B2 | * | 5/2011 | Haba et al. | 257/697 |
| 8,294,283 B2 | | 10/2012 | Ihara | |
| 8,324,023 B2 | | 12/2012 | Lam | |
| 2004/0104476 A1 | * | 6/2004 | Iwamoto | 257/737 |
| 2007/0200234 A1 | * | 8/2007 | Gerber et al. | 257/734 |
| 2010/0327433 A1 | | 12/2010 | Sweeney et al. | |

FOREIGN PATENT DOCUMENTS

| | | |
|---|---|---|
| JP | 2007 005559 A | 1/2007 |
| TW | 200625479 B | 7/2006 |
| TW | 289591 B | 11/2007 |
| TW | 200805616 A | 1/2008 |
| TW | 200837910 A | 9/2008 |
| TW | 200937591 A | 9/2009 |
| TW | 201108378 A | 3/2011 |
| TW | 201123371 A | 7/2011 |

OTHER PUBLICATIONS

Lin, Bo-Yi, "Characteristics of Halogen-Free Solder Mask," Proceeding of Nanometer-Scale Technology and Materials Symposium 2010, 2 pages.

* cited by examiner

SEMICONDUCTOR DEVICES, PACKAGING METHODS AND STRUCTURES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One smaller type of packaging for semiconductors is a flip chip (FC) ball grid array (BGA) package, in which semiconductor die are placed upside-down on a substrate and bonded to the substrate using micro-bumps. The substrate has wiring routed to connect the micro-bumps on the die to contact pads on the substrate that have a larger footprint. An array of solder balls is formed on the opposite side of the substrate and is used to electrically connect the packaged die to an end application.

However, some FC-BGA packages tend to exhibit bending, where warping of the substrate occurs during processing, such as during temperature stress. The bending causes reliability issues and bond breakage of the micro-bumps.

Thus, what are needed in the art are improved packaging techniques for semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to generally to semiconductor devices, and more particularly to the packaging of integrated circuits. Novel packaged semiconductor devices are disclosed, wherein a spacer is used to prevent bending of a substrate of the package and a semiconductor die during the packaging process, thermal cycling, and in the end applications the packaged semiconductor devices are used in. Either a thickness of the die, a thickness of the substrate of the package, or both, is increased using spacers to fill a region between the substrate and die, to be described further herein.

Figure 1:
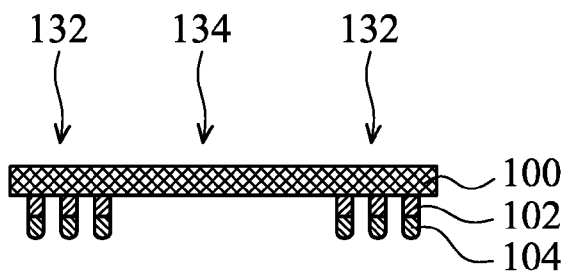
FIGS. 1 through 5 show cross-sectional views of a method of packaging an integrated circuit die in accordance with an embodiment of the present disclosure, wherein a spacer is attached to the die in a central region of the die.

FIGS. 1 through 5 show cross-sectional views of a method of packaging an integrated circuit die 100 in accordance with an embodiment of the present disclosure. Referring first to FIG. 1, an integrated circuit die 100 is provided. The integrated circuit die 100 may comprise a plurality of circuits and electrical components formed thereon, not shown. The integrated circuit die 100 may have been previously fabricated on a semiconductor wafer (not shown) comprising a semiconductor material such as silicon or other semiconductors and singulated on scribe lines to form a plurality of single dies 100, for example. The integrated circuit die 100 has a surface with a peripheral region 132 proximate the edges of the die 100 (e.g., proximate a perimeter of the die 100). The integrated circuit die 100 surface also has a central region 134 disposed within the peripheral region 132. The integrated circuit die 100 may comprise a shape of a square or rectangle in a top view (not shown in FIG. 1; see FIG. 10). The integrated circuit die 100 is also referred to herein as a die or a semiconductor device, for example.

The integrated circuit die 100 includes a plurality of bumps 102/104 formed on a surface thereof. In some embodiments, the bumps 102/104 comprise micro-bumps, for example. The bumps 102/104 are formed in the peripheral region 132 of the die 100 and may be arranged in one or more rows in the peripheral region 132. As an example, the bumps 102/104 are arranged in three rows on each side of the integrated circuit die 100 in FIGS. 1 through 6. Each bump 102/104 may include a metal stud 102 that may comprise copper, a copper alloy, or other metals, and solder 104 formed over the metal stud 102. The bumps 102/104 may alternatively comprise other materials.

Figure 2:
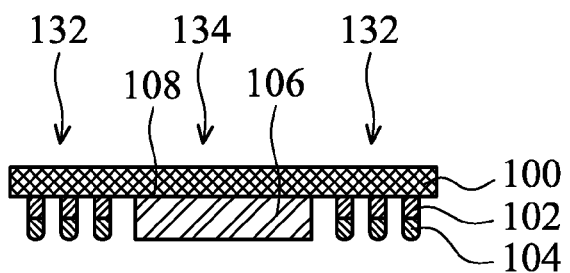

In accordance with an embodiment of the present disclosure, a thickness of the integrated circuit die 100 in the central region 134 is increased using a spacer 106. The spacer 106 is coupled or attached to the integrated circuit die 100 in the central region 134 of the integrated circuit die 100, as shown in FIG. 2. The spacer 106 comprises a thickness that is about less than or equal to a height of the bumps 102/104, to be described further herein. The spacer 106 may comprise a thickness of about 50 μm or less in some embodiments, although alternatively, the spacer 106 may comprise other dimensions.

The spacer 106 comprises a same or similar material to the material of the integrated circuit die 100 in some embodiments. For example, the spacer 106 may comprise a dummy die comprised of silicon, germanium, or other semiconductive material that the integrated circuit die 100 is comprised of. In other embodiments, the spacer 106 may comprise a same or similar material to a solder mask material used for another processing step of the packaged semiconductor device. For example, a solder mask material may be used to form the bumps 102/104, e.g., to mask portions of the integrated circuit die 100 while the bumps 102/104 are formed, or to mask portions of the substrate 110 while solder balls 128 (see FIGS. 9 and 10) are formed on the substrate 110. The spacer 106 comprising the solder mask material may include one or more main agents. The main agent may comprise one or more of the following: an acrylic resin, a filler such as silica, a photo initiator, coloring pigment, an epoxy hardener, an additive, and/or an organic solvent, as examples. The spacer 106 comprising the solder mask material may also include a hardener. The hardener may comprise one or more of the following: a resin such as acrylic resin, an acrylic monomer, an epoxy, a filler, and/or an organic solvent. In other embodiments, the spacer 106 may comprise a B stage epoxy material. The B stage epoxy material may comprise an intermediate stage in the reaction of certain thermosetting resins, in which the material softens when heated and swells when in contact with certain liquids, but may not entirely fuse or dissolve. The resin in an uncured thermosetting system is usually in this stage, for example. Alternatively, the spacer 106 may comprise other materials; the materials listed herein are merely examples.

The spacer 106 is attached to the integrated circuit die 100 using an adhesive 108. The adhesive 108 may comprise a glue, polymer, epoxy, film, or multiple layers or combinations thereof, as examples, in some embodiments. The adhesive 108 may also comprise other materials.

Figure 3:
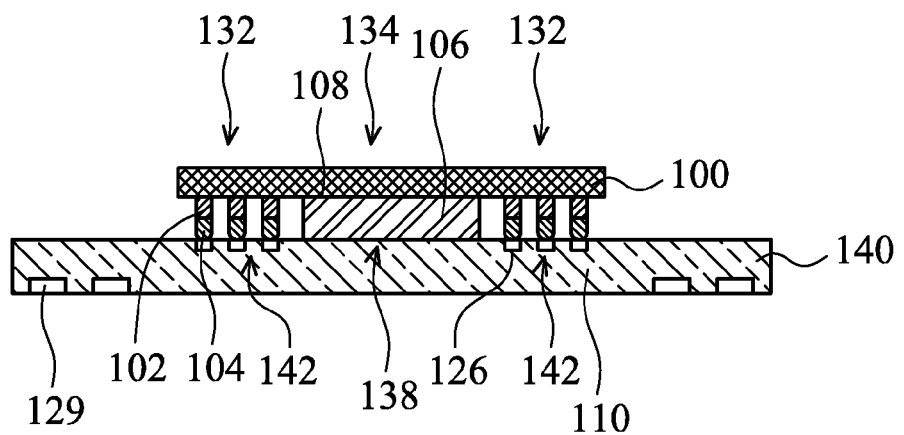

Next, a substrate 110 is provided, as shown in FIG. 3. The substrate 110 may comprise a ceramic, plastic, and/or organic material having a thickness of about 100 μm, as examples, although alternatively, the substrate 110 may comprise other materials and dimensions. The substrate 110 comprises a package for the integrated circuit die 100. The substrate 110 has a first surface, e.g., the top surface of the surface in FIG. 3. The substrate 110 also has a second surface opposite the first surface. The second surface comprises the bottom surface in FIG. 3. The substrate has a central region 138, a peripheral region 140, and an intermediate region 142 disposed between the peripheral region 140 and the central region 138 in a top view of the substrate 110 (see FIG. 10). The substrate 110 may comprise a substrate for a flip-chip ball grid array (FC-BGA) package, a flip-chip chip scale package (FC-CSP), or a land grid array (LGA) package, although alternatively, other types of substrates may be used.

A plurality of bond pads 126 is disposed on the first surface of the substrate 110 in the intermediate region 142. The bond pads 126 are adapted to be coupled to the bumps 102/104 of the integrated circuit die 100. A plurality of contact pads 129 is disposed on the second surface of the substrate 110 in the peripheral region 140. The contact pads 129 are adapted to be coupled a plurality of solder balls 128 (not shown in FIG. 3; see FIG. 9).

A plurality of electrical connections is disposed in the substrate 110, not shown in the figures. The plurality of electrical connections is disposed between and electrically connects the plurality of contact pads 129 and the plurality of bond pads 126 of the substrate 110. The electrical connections may comprise traces of electrical wiring formed by lithography within the substrate 110 or formed proximate a surface of the substrate 110, for example. The electrical connections may comprise copper, aluminum, other metals, or multiple layers or combinations thereof, as examples. The plurality of electrical connections may comprise a redistribution layer (RDL) (not shown) formed in the substrate 110, e.g., proximate a surface of the substrate 110 in some embodiments. The RDL may include fan-out regions of wiring. The integrated circuit die 100 may be electrically coupled to the RDL of the substrate 100. The substrate 110 may include an optional under bump metallization (UBM) structure (also not shown; see UBM 124 of the die 100 shown in FIG. 6, which is similar) coupled to the RDL. The optional UBM may facilitate in coupling the solder balls 128 (see FIGS. 9 and 10) to the substrate 110, for example.

The substrate 110 is attached to the integrated circuit die 100, as shown in FIG. 3. Bumps 102/104 of the integrated circuit die 100 are coupled to bond pads 126 of the substrate 110, using a solder process, solder reflow process, and/or thermal compression bonding, as examples. Alternatively, other methods may be used to electrically connect the integrated circuit die 100 to the substrate 110.

Figure 4:
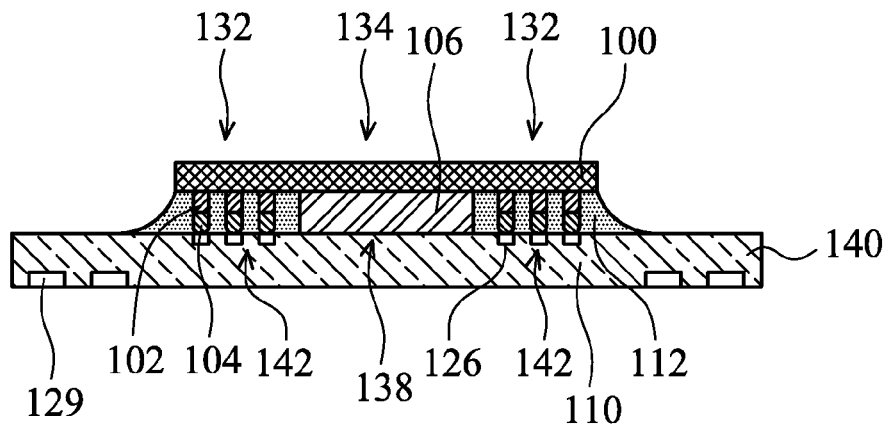
Figure 5:
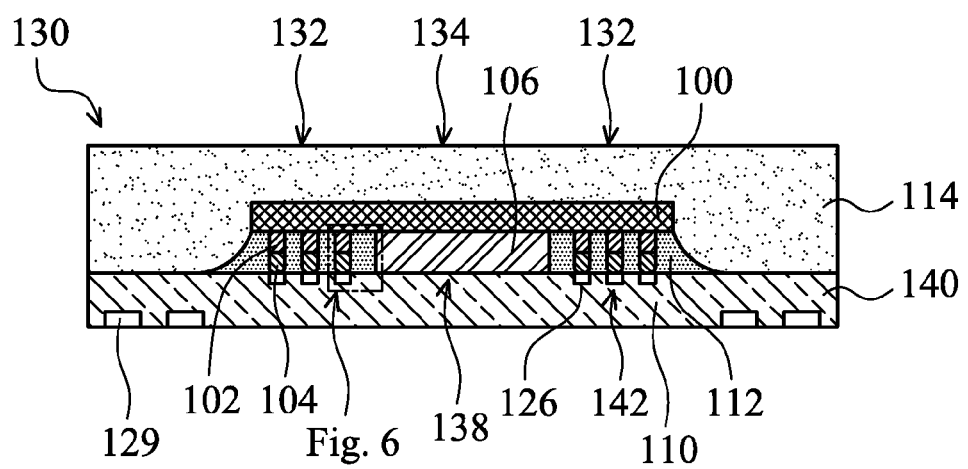

An under-fill material 112 is formed over the integrated circuit die 100, as shown in FIG. 4. The under-fill material 112 may comprise a filler, an epoxy, a hardener, or multiple layers or combinations thereof, as examples, although alternatively, the under-fill material 112 may comprise other materials. A compound material 114 is formed over the integrated circuit, the under-fill material 112, and the substrate 110, as shown in FIG. 5. The compound material may comprise an epoxy, a filler, an organic material, or multiple layers or combinations thereof, for example, although the compound material 114 may also comprise other materials. The compound material 114 may extend above a top surface of the integrated circuit die by about 10 μm or greater, for example. If the integrated circuit die 100 is large, a greater amount of compound material 114 may be used, to provide more robustness for the package, in some embodiments.

Figure 6:
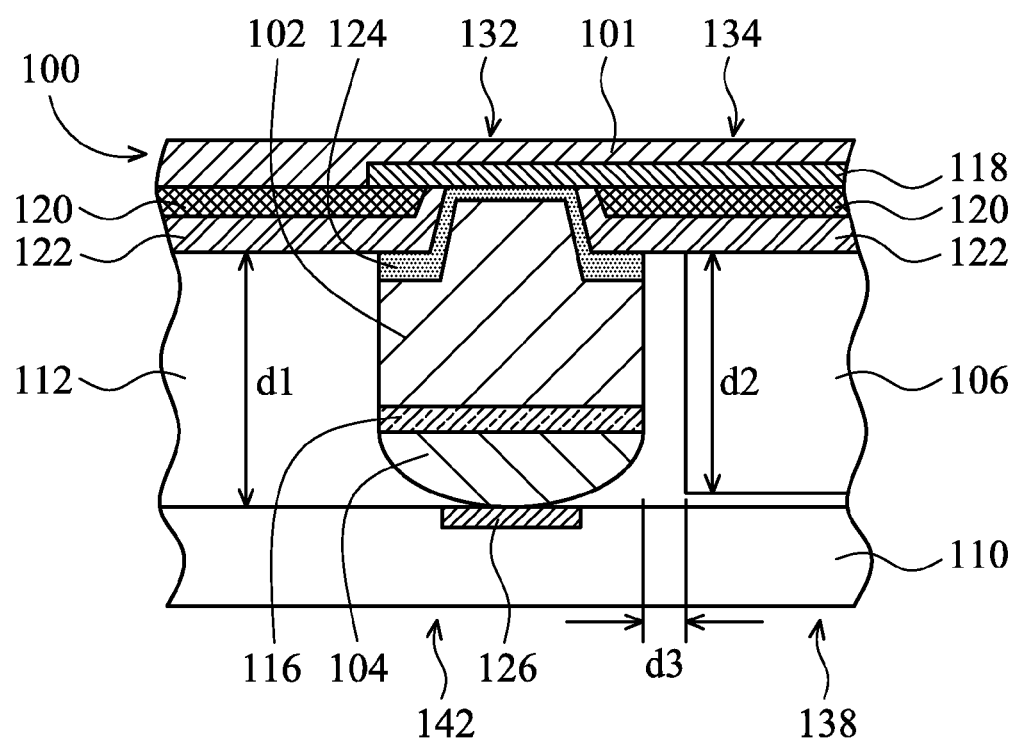
FIG. 6 shows a more detailed cross-sectional view of a portion of FIG. 5 including a bump region of the die and the spacer.

FIG. 6 shows a more detailed cross-sectional view of a portion of FIG. 5 including a bump region of the die 100 and the spacer 110. Portions of the peripheral region 132 of the die 100 and the central region 134 of the die 100, and portions of the intermediate region 142 and the central region 138 of the substrate 110 are shown in FIG. 6.

The die 100 includes a workpiece 101 comprising silicon or other semiconductive material. Insulating materials 120 and 122 and conductive lines 118 are formed over the workpiece 101. The conductive lines 118 may be electrically coupled between the bumps 102/104 and electrical components of the workpiece 101, for example. The conductive lines 118 may comprise aluminum pads in some embodiments, for example, although other metals may be used. The bumps 102/104 may include an optional metal cap 116 disposed between the metal studs 102 and the solder bumps 104, as shown. The metal cap 116 may comprise nickel or other metals, for example. An under ball metallization (UBM) 124 structure is optionally formed over the conductive lines 118 of the die 100.

The bumps 102/104/116 may comprise a height (in a vertical direction in the drawings) or thickness of dimension $d_1$, wherein dimension $d_1$ comprises about 50 μm or less in some embodiments. The bumps 102/104/116 may comprise a width of about 35 μm, for example, and may have a pitch or distance between bumps 102/104/116 of about 60 μm, as examples. The spacer 106 comprises a thickness of dimension $d_2$ in a vertical direction that is substantially the same or less than dimension $d_1$, for example. The spacer 110 is spaced away laterally from a closest bump 102/104/116 by a dimension $d_3$ that may comprise about 10 μm or less in some embodiments. Alternatively, dimensions $d_1$, $d_2$, $d_3$, and the width and pitch of the bumps 102/104/116 may comprise other dimensions.

The central region 134 of the integrated circuit die 100 is substantially aligned with the central region 138 of the substrate 110. The spacer 106 substantially fills a gap between the central region 134 of the integrated circuit die 100 and the central region 138 of the substrate 110 in some embodiments of the present disclosure, for example.

Figure 7:
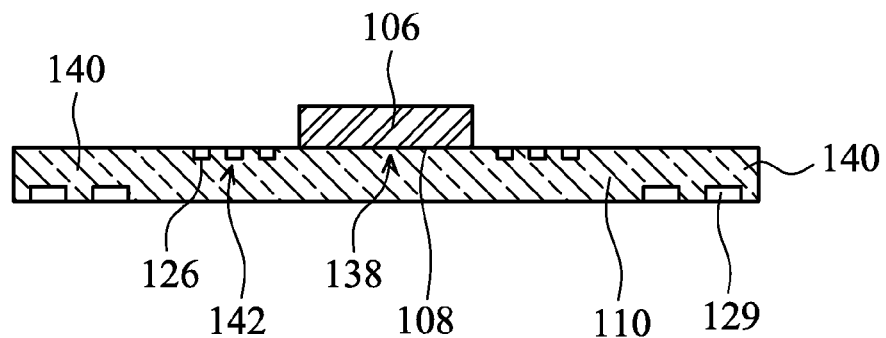
FIG. 7 shows a cross-sectional view of a method of packaging an integrated circuit die in accordance with another embodiment, wherein a spacer is attached to a substrate of the package in a central region of the substrate.

FIG. 7 shows a cross-sectional view of a method of packaging an integrated circuit die 100 in accordance with another embodiment. In this embodiment, a spacer 106 is attached to the substrate 110 of the package in a central region 138 of the substrate 110. Like numerals are used for the various elements in FIG. 7 that were used to describe FIGS. 1 through 6, and to avoid repetition, each reference number shown in FIG. 7 is not described again in detail herein. The spacer 106 may comprise similar materials as described for the spacer 106 in FIG. 2, for example.

In this embodiment, the thickness of the substrate 110 is increased using the spacer 106 attached in the central region 138. The spacer 106 is disposed on the first (e.g., top) surface of the substrate 110 in the central region 138, as shown. The bumps 102/104 of the integrated circuit die 100 are then coupled to the bond pads 126 of the substrate 110, as described in the previous embodiment, and the packaging of the integrated circuit die 100 is completed, forming the packaged semiconductor device 130 shown in FIG. 5.

Figure 8:
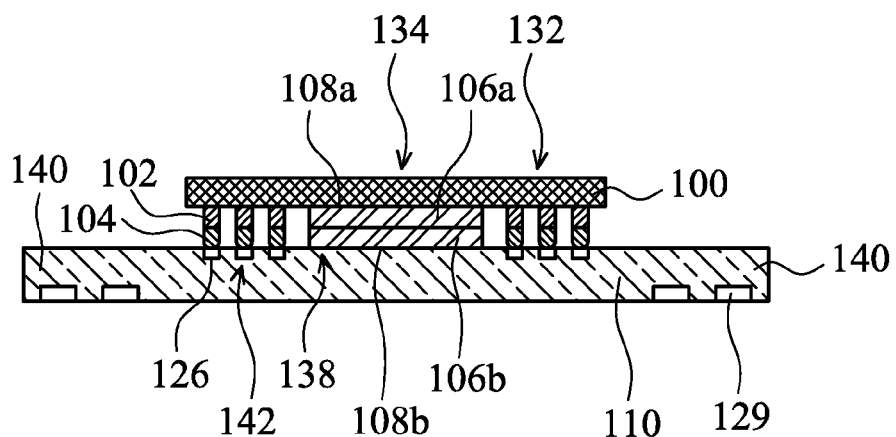
FIG. 8 shows another embodiment, wherein a spacer is formed on both the integrated circuit die and the substrate.

FIG. 8 shows another embodiment wherein a first spacer 106a is formed on the integrated circuit die 100 and a second spacer 106b is formed on the substrate 110. Each spacer 106a and 106b is glued with adhesive 108a and 108b to the die 100 and to the substrate 110, respectively. The total height or thickness of the spacers 106a and 106b is about less than or equal to the space between the substrate 110 and the die 100, e.g., dimension $d_1$ comprising the height of the bumps 102/104 as described with respect to FIG. 6.

Figure 9:
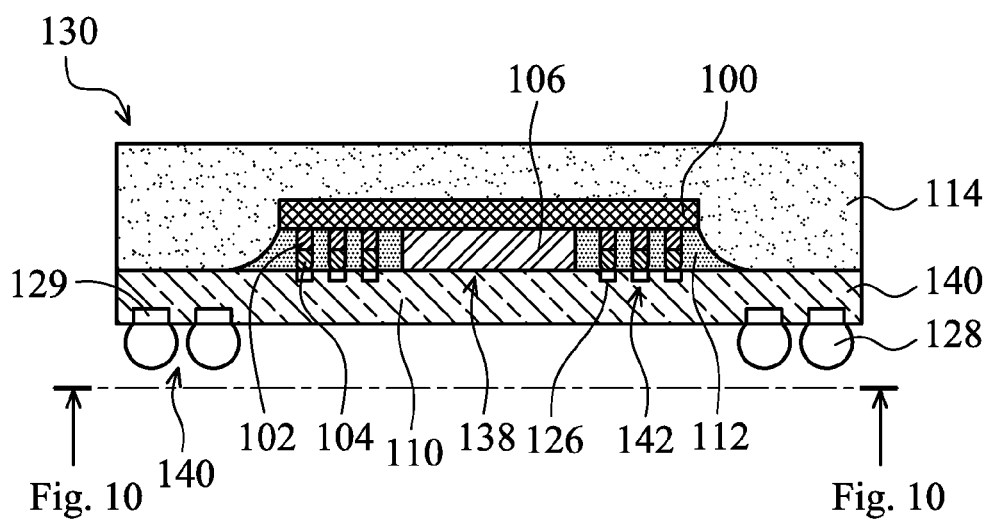
FIG. 9 shows a cross-sectional view of a packaged semiconductor device after solder balls have been formed on contact pads of the substrate.

FIG. 9 shows a cross-sectional view of a packaged semiconductor device 130 after solder balls 128 have been formed on contact pads 129 of the substrate 110. The packaged semiconductor device 130 may then be attached using the solder balls 128 to another device, printed circuit board (PCB), or other end applications.

Figure 10:
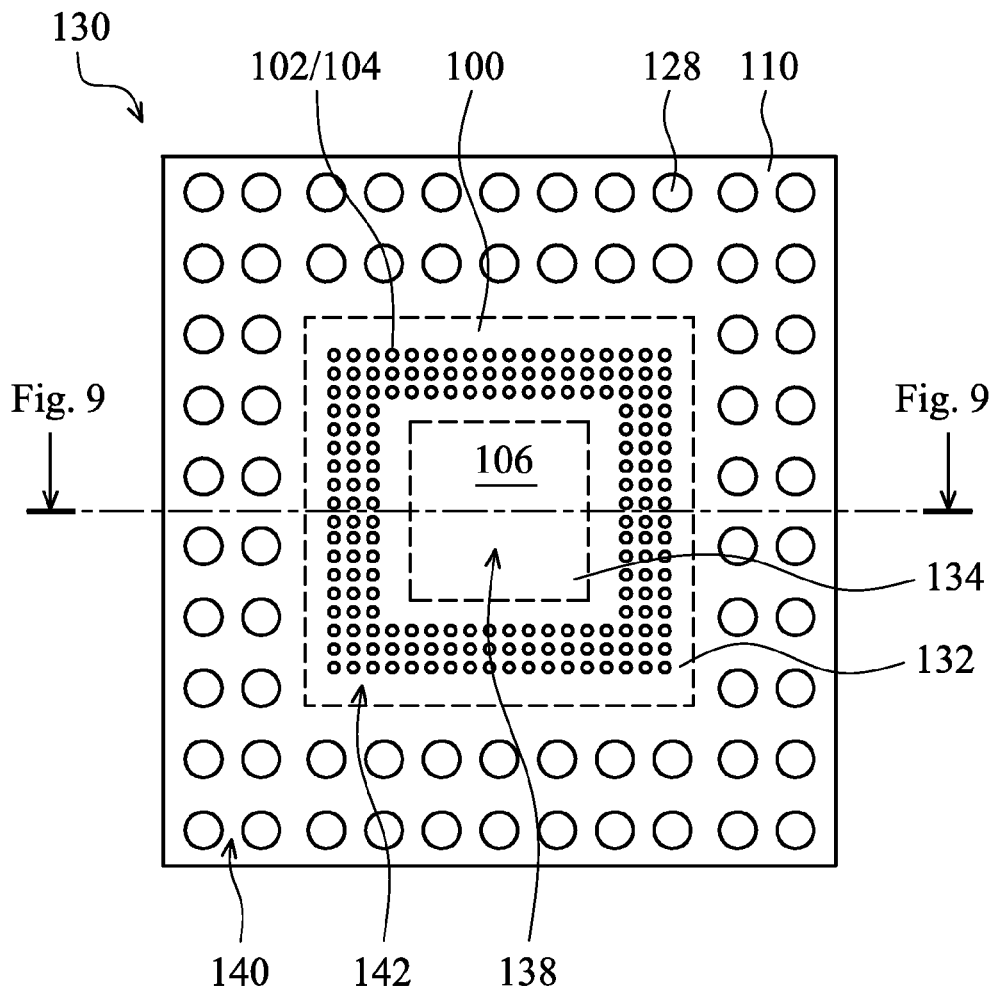
FIG. 10 shows a top view of a packaged semiconductor device after the integrated circuit die has been attached to the substrate.

FIG. 10 shows a top view of a packaged semiconductor device 130 after the integrated circuit die 100 has been attached to the substrate 110. The die 100 and spacer 106 are shown in phantom beneath the substrate 110. A possible layout of solder balls 128 and bumps 102/104 is shown; however, alternatively, the layout of the solder balls 128 on the substrate 110 and the bumps 102/104 on the integrated circuit die 100 may comprise various other configurations in accordance with embodiments of the present disclosure.

Advantages of embodiments of the disclosure include providing novel packaging techniques that have increased reliability and higher yields due to the use of the spacers 106, 106a, and 106b disposed between the die 100 and the substrate 110. The packages provide a high input/output (I/O) for die 100 on a fine pitch, have low power consumption, and low resistive/capacitive (R/C) delay. A bending effect during reliability testing and thermal stress is reduced or eliminated by embodiments of the disclosure described herein, due to the presence of the spacers 106, 106a, and 106b between the die 100 and substrate 110 central regions 134 and 138, respectively. Cracks in connections of the bumps 102/104 and delaminations of the various material layers of the package (which may comprise low dielectric constant (k) material layers) are reduced or minimized, improving reliability. The presence of the spacers 106, 106a, and 106b also advantageously facilitate the alignment of the die 100 to the substrate 110 during the packaging process. The spacers 106, 106a, and 106b improve control of stand-on height of the die 100 attachment to the substrate 110, and result in improved filling of the under-fill material 112. The novel packaging methods for semiconductor devices 100 are easily implemented in manufacturing and packaging process flows.

Embodiments of the present disclosure include semiconductor devices or die 100 having the spacer 106 formed in a central region 134, and substrates 110 having the spacer 106 formed in a central region 138. Embodiments of the present disclosure include the methods of packaging semiconductor devices or die 100 described herein, and also include packaged semiconductor devices 130 that have been packaged using the methods and materials described herein.

In one embodiment, a semiconductor device includes an integrated circuit die with a surface having a peripheral region and a central region. A plurality of bumps is disposed on the surface of the integrated circuit die in the peripheral region. A spacer is disposed on the surface of the integrated circuit die in the central region.

In another embodiment, a package for a semiconductor device includes a substrate, the substrate having a first surface and a second surface opposite the first surface. The substrate includes a peripheral region, a central region, and an intermediate region disposed between the peripheral region and the central region in a top view. A plurality of bond pads is disposed on the first surface of the substrate in the intermediate region, and a spacer is disposed on the first surface of the substrate in the central region. A plurality of contact pads is disposed on the second surface of the substrate in the peripheral region. A plurality of electrical connections is disposed in the substrate. The plurality of electrical connections is disposed between and electrically connects the plurality of contact pads and the plurality of bond pads.

In yet another embodiment, a packaged semiconductor device includes an integrated circuit die having a surface with a peripheral region and a central region. A plurality of bumps is disposed on the surface of the integrated circuit die in the peripheral region. A substrate is coupled to the plurality of bumps of the integrated circuit die. A spacer is disposed between the substrate and the integrated circuit die proximate the central region of the integrated circuit die. A plurality of solder balls is disposed on a surface of the substrate.

In another embodiment, a method of packaging a semiconductor device includes providing a substrate having a central region. An integrated circuit die is provided, the integrated circuit die having a peripheral region and a central region. The integrated circuit die has a plurality of bumps disposed on a surface thereof in the peripheral region. A spacer is formed between the central regions of the substrate and the integrated circuit die, and the integrated circuit die is electrically coupled to the substrate. An under-fill material is formed over the integrated circuit die, and a molding compound is formed over the integrated circuit die, the under-fill material, and the substrate. A plurality of solder balls is formed on the substrate.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   an integrated circuit die, the integrated circuit die comprising a surface having a peripheral region and a central region:
   a plurality of bumps disposed on the surface of the integrated circuit die in the peripheral region;
   a substrate, the plurality of bumps electrically coupling the integrated circuit die to the substrate; and
   a spacer disposed between only the central region of the integrated circuit die and the substrate, the spacer being adhered to only one of the integrated circuit die and the substrate along an axis orthogonal to a major surface of the substrate and having a thickness less than a distance between the integrated circuit die and the substrate, the axis passing through the spacer.

2. The semiconductor device according to claim 1, wherein the spacer is spaced apart from the plurality of bumps by about 10 μm or greater.

3. The semiconductor device according to claim 1, wherein the plurality of bumps includes a plurality of metal studs.

4. A package for a semiconductor device, the package comprising:
   a substrate, the substrate having a first surface and a second surface opposite the first surface, the substrate having a first peripheral region, a first central region, and a first intermediate region disposed between the first peripheral region and the first central region in a top view of the substrate;
   a plurality of bond pads disposed on the first surface of the substrate in the first intermediate region;
   an integrated circuit die, the integrated circuit die comprising a third surface having a second peripheral region and a second central region; and
   a plurality of bumps disposed on the third surface of the integrated circuit die in the second peripheral region;
   a spacer disposed between the first surface of the substrate in only the first central region and the third surface of the integrated circuit die in the second central region, the spacer having a first spacer surface and a second spacer surface opposite the first spacer surface, one of the first spacer surface and the second spacer surface being bonded to another surface along an axis orthogonal to a major surface of the substrate, the axis passing through the spacer, the second spacer surface not being bonded to another surface along the axis;
   a plurality of contact pads disposed on the second surface of the substrate in the peripheral region; and
   a plurality of electrical connections disposed in the substrate, wherein the plurality of electrical connections is disposed between and electrically connects the plurality of contact pads and the plurality of bond pads;
   wherein the substrate is coupled to the plurality of bumps of the integrated circuit die; and
   wherein a thickness of the spacer is less than a distance between the third surface of the integrated circuit die and the first surface of the substrate.

5. The package according to claim 4, wherein the spacer comprises a thickness of about 50 μm or less.

6. The package according to claim 4, wherein the substrate comprises a flip-chip ball grid array (FC-BGA) package, a flip-chip chip scale package (FC-CSP), or a land grid array (LGA) package.

7. The package according to claim 4, further comprising a plurality of solder balls coupled to the plurality of contact pads.

8. The package according to claim 4, wherein the spacer comprises silicon.

9. The package according to claim 4, wherein the spacer comprises a same material as a solder mask material used to form the plurality of bumps on the third surface of the integrated circuit die or a plurality of solder balls on the substrate.

10. The package for a semiconductor device according to claim 4, wherein the spacer comprises a main agent and a hardener.

11. The package according to claim 10, wherein the main agent comprises a material selected from the group consisting essentially of an acrylic resin, a filler such as silica, a photo initiator, coloring pigment, an epoxy hardener, an additive, an organic solvent, and combinations thereof.

12. The package according to claim 10, wherein the hardener comprises a material selected from the group consisting essentially of a resin such as acrylic resin, an acrylic monomer, an epoxy, a filler, an organic solvent, and combinations thereof.

13. The package according to claim 4, wherein the spacer comprises a B-stage epoxy.

14. A semiconductor device, comprising:
   an integrated circuit die, the integrated circuit die comprising a first surface having a first peripheral region and a first central region;
   a substrate, the substrate comprising a second surface having a second peripheral region, a second central region, and a second intermediate region disposed between the second peripheral region and the second central region;
   spacers interposed between the first surface of the integrated circuit die in only the first central region and the second surface of the substrate in the second central region, each of the spacers having a thickness less than a distance between the integrated circuit die and the substrate, wherein a first spacer of the spacers is directly attached only to the first surface and a second spacer of the spacers is directly attached only to the second surface, the first spacer not being adhered to the second spacer along an axis perpendicular to a major surface of the substrate, the axis passing through both the first spacer and the second spacer; and
   an underfill interposed between the integrated circuit die and the substrate.

15. The semiconductor device of claim 14, wherein the first spacer of the spacers is attached to the integrated circuit die using an adhesive and the second spacer of the spacers is attached to the substrate using an adhesive.

* * * * *